United States Patent

Kubo et al.

Patent Number: 5,840,631
Date of Patent: Nov. 24, 1998

[54] METHOD OF MANUFACTURING SEMICONDUCTOR DEVICE

[75] Inventors: Akira Kubo; Tetsuya Homma; Koji Kishimoto, all of Tokyo, Japan

[73] Assignee: NEC Corporation, Tokyo, Japan

[21] Appl. No.: 562,991

[22] Filed: Nov. 27, 1995

[30] Foreign Application Priority Data

Nov. 28, 1994 [JP] Japan .................................. 6-293069

[51] Int. Cl.$^6$ .............................................. H01L 21/443
[52] U.S. Cl. ...................... 438/789; 438/788; 438/790; 427/585; 427/588
[58] Field of Search .................. 427/585, 588; 438/789, 790, 788, 783, 784

[56] References Cited

U.S. PATENT DOCUMENTS

| | | | |
|---|---|---|---|
| 4,360,393 | 11/1982 | Koval | 148/171 |
| 5,165,955 | 11/1992 | Gentle | 427/575 |
| 5,314,724 | 5/1994 | Tsukune et al. | 427/489 |
| 5,360,646 | 11/1994 | Morita | 427/574 |
| 5,413,967 | 5/1995 | Matsuda et al. | 437/235 |
| 5,420,075 | 5/1995 | Homma et al. | 437/195 |
| 5,462,899 | 10/1995 | Ikeda | 437/238 |
| 5,470,800 | 11/1995 | Muroyama | 437/238 |
| 5,593,741 | 1/1997 | Ikeda | 427/579 |
| 5,763,018 | 6/1998 | Sato | 427/535 |

FOREIGN PATENT DOCUMENTS

| | | |
|---|---|---|
| 4-246846 | 9/1992 | Japan . |
| 4-343456 | 11/1992 | Japan . |
| 6-168930 | 6/1994 | Japan . |

OTHER PUBLICATIONS

S. Wolf "Silicon Processing for the VLSI Era vol. 2" Lattice Press, Calif. (1990) pp. 194–198 (no month).

Tedder et al., "Catalytic effect of phosphine on the deposition of . . . tetraethoxysilane", *Appl. Phys. Lett.*, vol. 62, No. 7, Feb. 15, 1993, pp. 699–701.

Muroyama et al., "Formation of Dielectric Films for Gap- -Filling by . . . Deposition", *Jpn. J. Appl. Phys.*, vol. 32, Part 1, No. 12B, Dec. 1993, pp. 6122–6125.

*Primary Examiner*—Caridad Everhart
*Attorney, Agent, or Firm*—Sughrue, Mion, Zinn, Macpeak & Seas, PLLC

[57] ABSTRACT

A method of manufacturing a semiconductor device includes the following steps. A lower wiring layer is formed on a semiconductor substrate through an insulating film. A compound gas having a catalysis for promoting formation of silicon oxide is added in an atmosphere using a main component gas consisting of ozone, water vapor, and one of alkoxysilane and organosiloxane as a source gas to form a silicon oxide film by a chemical vapor deposition (CVD) method directly on a surface of the semiconductor substrate on which the lower wiring layer is formed. An upper wiring layer is formed on the silicon oxide film.

15 Claims, 9 Drawing Sheets

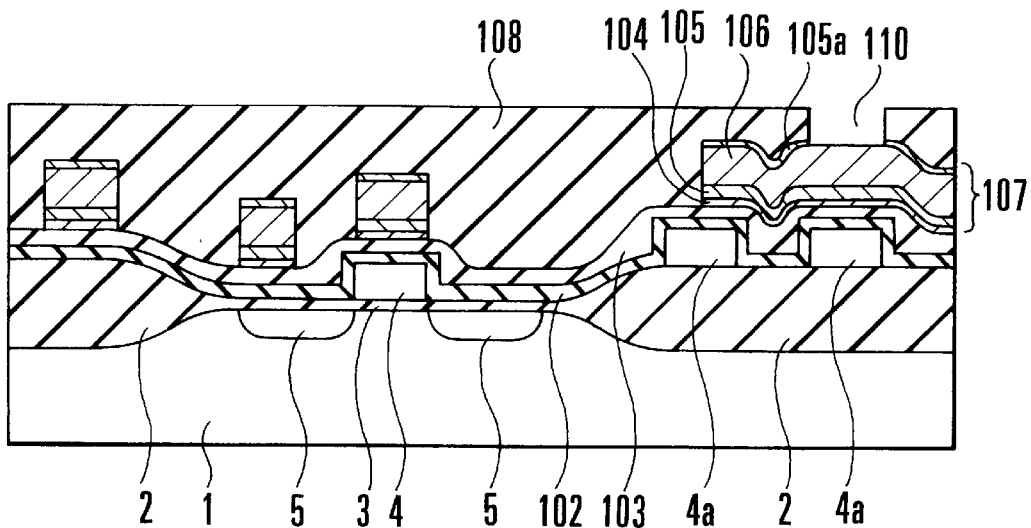
F I G. 1E
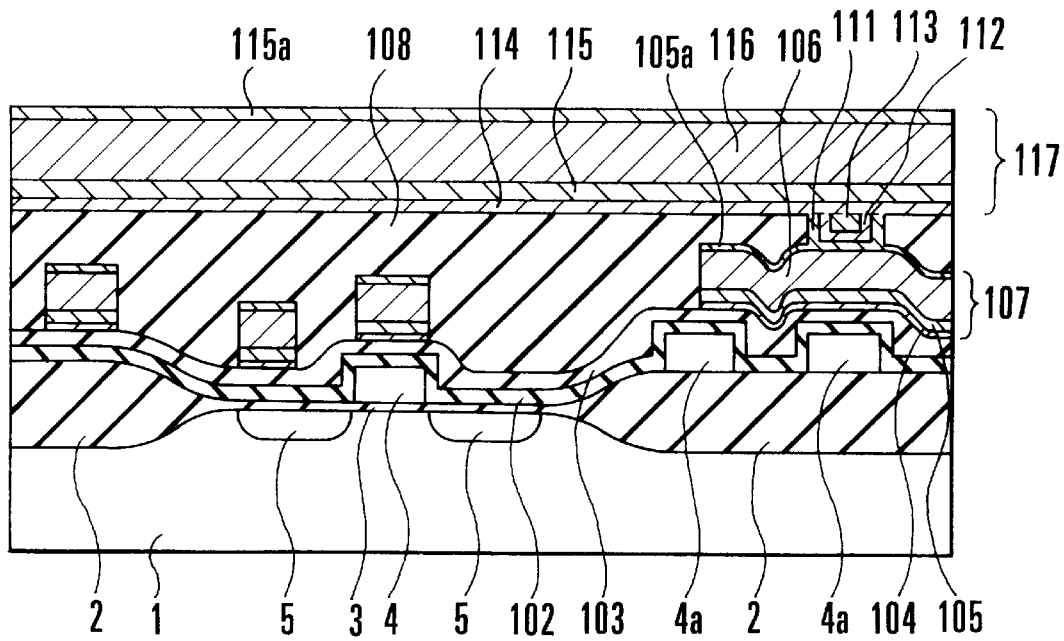
F I G. 1F

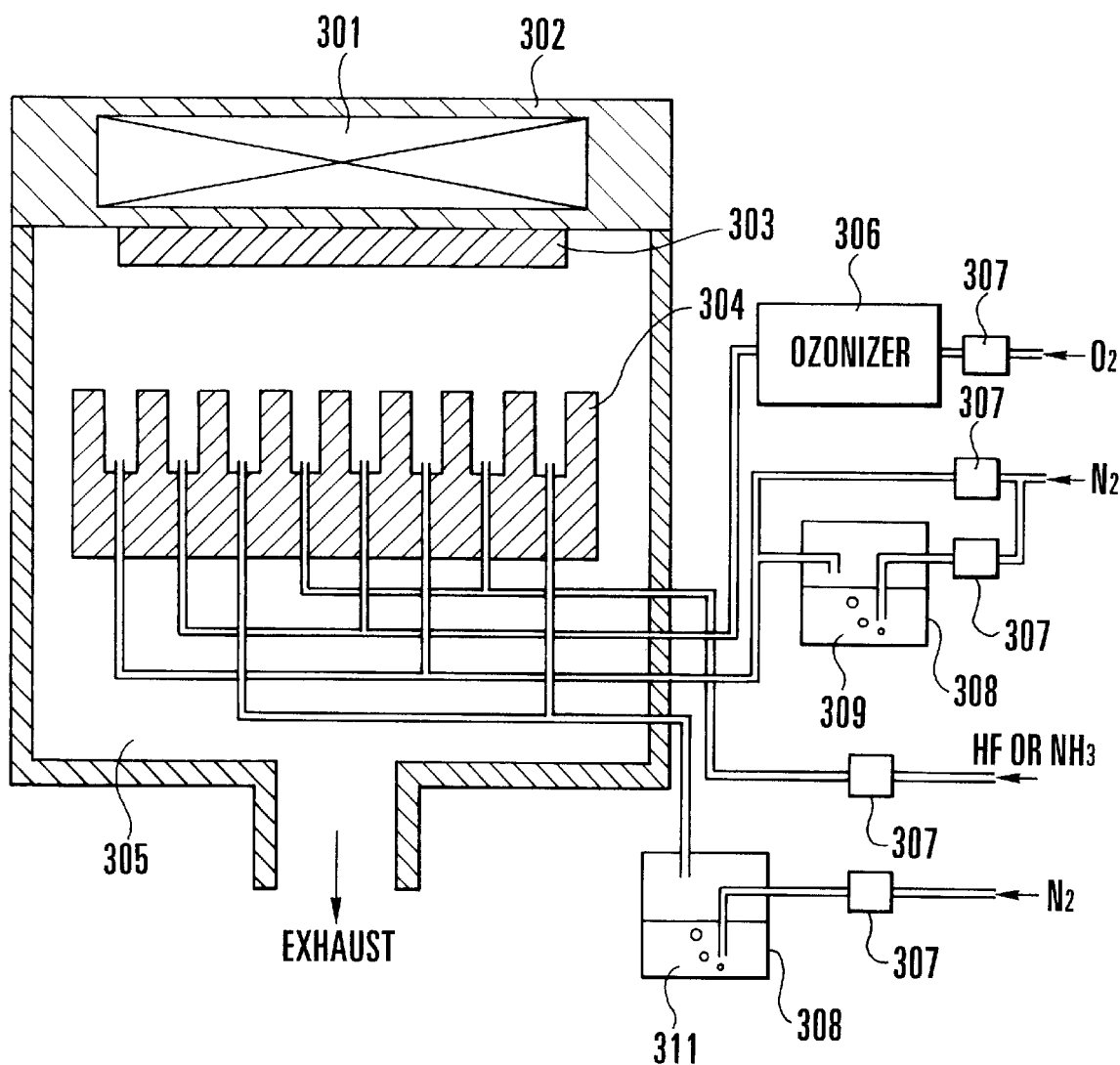
F I G. 4

METHOD OF MANUFACTURING SEMICONDUCTOR DEVICE

BACKGROUND OF THE INVENTION

The present invention relates to a method of manufacturing a semiconductor device having an insulating interlayer for multilevel interconnection.

With high integration of semiconductor devices, micropatterning of interconnection, formation of multilevel interconnection, and a decrease in wiring interval must be realized. At the same time, demands or an insulating interlayer becomes strict. Properties for an effective insulating interlayer are resistance to cracking excellent burying properties in two adjacent gap portions in a lower wiring layer, and good step coverage with respect to an underlayer, and smooth surfaces.

When a lower wiring layer mainly consists of an Al-based metal, Cu, or Au, the following insulating interlayers, which satisfy some of the above required properties, can be employed.

First, there is a silicon oxide film, called an ozone tetraethoxysilane ($Si(OC_2H_5)_4$: to be referred to as TEOS hereinafter) film, which is formed by a thermal CVD (Chemical Vapor Deposition) method using ozone gas, and a source gas obtained by bubbling a TEOS solution with nitrogen gas or an inert gas such as Ar gas. This thermal CVD method comprises an APCVD (Atmospheric Pressure CVD) method and an LPCVD (Low Pressure CVD) method.

Even if the surface of an underlayer is greatly corrugated, the upper surface of this ozone TEOS film is smooth because of good step coverage. This good step coverage results because the use of organosilane gas as part of a source gas enhances migration of reaction gas molecules such as TEOS adsorbed in a film formation surface as compared with use of inorganic silane gas as a source gas as in the APCVD method using monosilane ($SiH_4$) gas and $O_2$.

This ozone TEOS film has a high water content and high water vapor adsorption properties. For example, in an ozone TEOS film upon formation at 400° C. by the thermal CVD method, the absorption coefficient of an infrared absorption (FT-IR) spectrum having a wavenumber of 3,400 $cm^{-1}$, which indicates OH radicals, is about 180 $cm^{-1}$. To the contrary, in a silicon oxide film formed by a plasma CVD method or a silicon oxide film formed by the thermal CVD method using inorganic silane gas as part of a source gas, this infrared absorption coefficient is smaller than a measurement limitation.

In this manner, if an ozone TEOS film having a high water content is used as an insulating interlayer for multilevel interconnection, a leakage current is increased between two adjacent gap portions in a lower wiring layer, a connection resistance is increased in a through hole portion, and a pinhole as a so-called "poisoned via" is generated. In addition, cracks are generated by film shrinkage upon annealing, a wiring resistance is increased by stress migration upon film formation, and a wiring reliability is degraded by disconnection, for example.

To solve the above problems of an ozone TEOS film, there are countermeasures described in Japanese Patents Laid-Open Nos. 4-246846 and 4-343456. Formation of an insulating interlayer on a polysilicon wiring layer described in Japanese Patent Laid-Open No. 4-246864 will be explained with reference to FIGS. 5A to 5E. FIGS. 5A to 5E show the steps of forming insulating interlayers of a semiconductor device during their manufacture.

First, a polysilicon film is deposited on a silicon substrate 501, and the obtained structure is patterned to form a polysilicon wiring layer 502. As shown in FIG. 5A, a TEOS-coagulated film 503 is deposited to a thickness of about 0.1 μm on the polysilicon wiring layer 502 by the LPCVD method using TEOS as a source. Then, water vapor whose temperature is held within room temperature to about 50° C. is sprayed to the surface of the TEOS-coagulated film 503 to cause the first reaction:

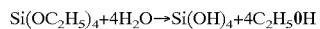

$C_2H_5OH$ the reaction, product of the first reaction, is evaporated by evacuation to convert the TEOS-coagulated film 503 to a silanol ($Si(OH)_4$) film 503a, as shown in FIG. 5B.

Next, infrared rays are irradiated in a nitrogen atmosphere at a reduced pressure, and the surface of the silanol film 503a is heated to about 700° C. for 15 sec to cause the second reaction:

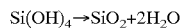

In the second reaction, the silanol film 503a is vitrified and hardened to form a silicon oxide film 503b free from cracks and having a thickness of about 0.05 to 0.1 μm, as shown in FIG. 5C. Thereafter, the above process from formation of a TEOS-coagulated film to formation of a silicon oxide film is repeated about 5 times to form an insulating interlayer 504 consisting of silicon oxide films and having a thickness of about 0.3 to 0.6 μm.

In this case, the TEOS-coagulated film is deposited thick at the corners of each groove, so that the corners of the groove in the wiring layer is rounded by repeating deposition of TEOS-coagulated films. As a result, the submicron-wide groove in the polysilicon wiring layer 502 is planarized, and the surface of the insulating interlayer 504 becomes almost smooth, as shown in FIG. 5D. Finally, an Al wiring layer 505 is formed on the insulating interlayer 504 by conventional sputtering and patterning, completing a two-level interconnection structure, as shown in FIG. 5E.

According to the above method, since the silicon oxide film almost free from generation of cracks and having a planarized surface can be formed, the reliability of an upper wiring layer can be assured, and the water-vapor resistance of the silicon oxide film itself is improved to improve the reliability of the lower wiring layer. In addition, since the insulating interlayer 504 consisting of the silicon oxide films is completely vitrified, gas is not discharged from the insulating interlayer 504 to a contact window in connecting the wiring layers. For this reason, the surface of the lower wiring layer will not be rendered nonconductive to assure a low contact resistance at a connection portion between the wiring layers. This method is effective for improving the yield and reliability of a semiconductor device having a multilevel interconnection structure.

On the other hand, Japanese Patent Laid-Open No. 4-343456 discloses formation of an insulating interlayer for an Al wiring layer. In this film formation, a film formation apparatus having an arrangement as shown in FIG. 6 is used. Nitrogen gas or Ar gas is mixed in a gas mixture of TEOS gas at 20 sccm and water vapor at 50 sccm. The resultant gas mixture is uniformly sprayed through a shower nozzle 602 to a wafer 601 which is placed in a reaction chamber 609 and has a selectively formed Al wiring layer. The wafer 601 is unloaded from a cassette 604 through an evacuated load lock chamber 603 by a convey system 603a, and placed in the reaction chamber 609.

The TEOS gas and the water vapor are generated from constant-temperature baths 607a and 607b. The flow rates of these gases are controlled by flow controllers (MFCs) 606a and 606b, and the gases are fed to a preliminary heating chamber 605, respectively. The flow rate of the nitrogen gas is controlled by a flow controller (MFC) 606c, and the gas is fed to the preliminary heating chamber 605. In the preliminary heating chamber 605, the gas mixture is heated up to a temperature at which a film is not formed to promote a pre-reaction. The gas pressure in the preliminary heating chamber 605 is about 20 Torr, and its temperature is about 200° C. The pressure in the reaction chamber 609 is 0.1 to 10 Torr, and the temperature of the wafer 601 is 450° C. Reference numeral 608 denotes a pressure gauge.

The pressure around the wafer 601 is increased by the effect of gas injection from the shower nozzle 602. With this increase, a temperature distribution is generated between the wafer 601 and a portion above the surface of the wafer 601 by several tens μm. This temperature distribution causes a temperature difference of 100° C. or more. For this reason, oxidation and densification of an oxide film simultaneously progress on the surface of the wafer 601, and a decomposition reaction of TEOS is also promoted immediately near the wafer 601 to form a dense silicon oxide film at a low temperature.

According to this method, a flat, dense, and high-quality silicon oxide film free from plasma damage can be formed at a relatively low temperature of 500° C. or less, and the reliability of an insulating interlayer can be improved. Further, the reliability of multilevel interconnection can also be improved because the stress applied to a film is small.

In the method of forming an insulating interlayer shown in FIGS. 5A to 5E, in forming the silanol film 503a, $H_2O$ (water vapor) is added to promote the first reaction. On the other hand, in forming the silicon oxide film 503b, heating is performed in the second reaction to remove water which remains in the silicon oxide film and to reduce water adsorption properties. By this method, however, the Si—OH bonds present in the silicon oxide film and on the surface thereof cannot be completely removed.

For this reason, if the silicon oxide film formed at a reduced pressure is exposed to the outer atmosphere, water in the outer atmosphere is adsorbed in the Si—OH bonds remaining in the film, so that the film undesirably has a high water content. In such a conventional method, an ozone TEOS film formed by the thermal CVD method using TEOS and ozone has a high water content and good water adsorption properties. In the method, shown in FIG. 6, which uses water vapor so as to solve these problems, the problem of water adsorption is left unsolved.

The conventional methods, therefore, cannot completely solve an increase in leakage current caused by the water content, an increase in connection resistance at a via hole portion, generation of pinholes, generation of cracks by film shrinkage upon annealing, an increase in wiring resistance and disconnection of wiring by stress migration during annealing upon film formation, and a shift of the threshold voltage of a MOS transistor in a high-temperature bias test.

SUMMARY OF THE INVENTION

It is an object of the present invention to provide a method of manufacturing a semiconductor device with an insulating interlayer having a low water content.

It is another object of the present invention to provide a method of manufacturing a semiconductor device with an insulating interlayer having excellent step coverage with respect to a lower wiring layer and free from generation of cracks.

In order to achieve the above objects, according to the present invention, there is provided a method of manufacturing a semiconductor device, comprising the steps of forming a lower wiring layer on a semiconductor substrate through an insulating film, adding a compound gas having a catalysis for promoting formation of silicon oxide in an atmosphere using a main component gas consisting of ozone, water vapor, and one of alkoxysilane and organosiloxane as a source gas to form a silicon oxide film by a chemical vapor deposition (CVD) method directly on a surface of the semiconductor substrate on which the lower wiring layer is formed, and forming an upper wiring layer on the silicon oxide film.

BRIEF DESCRIPTION OF THE DRAWINGS

FIGS. 1A to 1F are sectional views showing the steps of forming insulating interlayers of a semiconductor device to explain a method of manufacturing the semiconductor device according to the first embodiment of the present invention;

FIG. 4 is a view showing the arrangement of an APCVD apparatus used in a third embodiment;

DESCRIPTION OF THE PREFERRED EMBODIMENTS

Figure 1A:
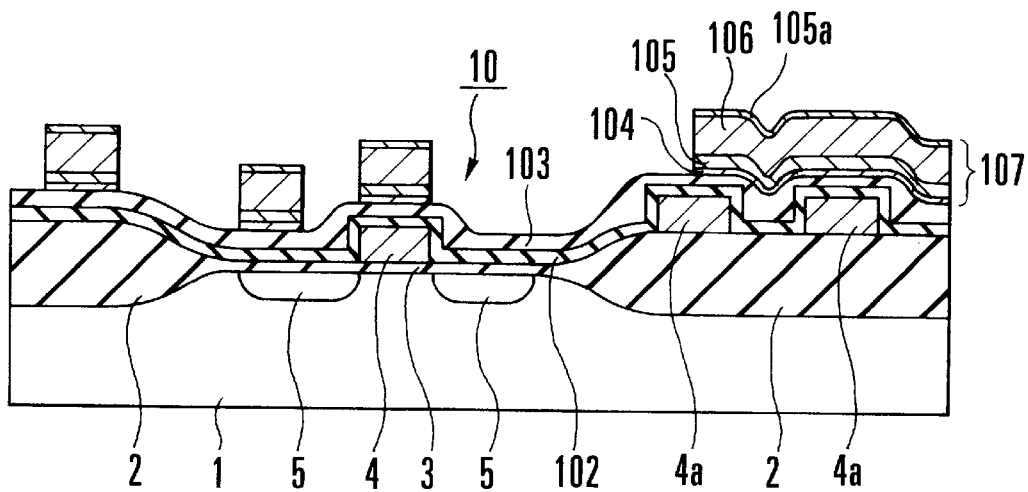
Figure 1B:
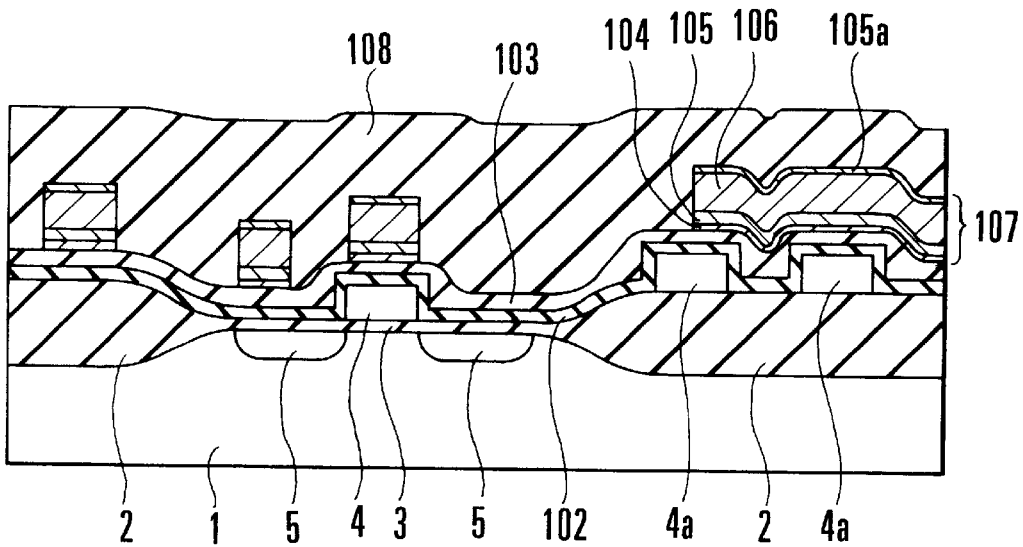

Embodiments of the present invention will be described below with reference to the accompanying drawings.
First Embodiment FIGS. 1A to 1F show the steps of forming insulating interlayers of a semiconductor device to explain a method of manufacturing the semiconductor device according to the first embodiment of the present invention. As shown in FIG. 1A, a semiconductor element 10 comprising a MOSFET (Metal Oxide Semiconductor Field Effect Transistor) is formed on a silicon substrate 1. The semiconductor element 10 comprises a gate electrode 4 formed on a gate insulating film 3 in a region surrounded by a field oxide film 2, source and drain regions 5 formed on both the side portions of the gate electrode 4 on the surface of the silicon substrate 1, polysilicon electrodes 4a formed on the field oxide film 2, and the like.

Referring to FIG. 1A, a 0.1-μm thick silicon oxide film (HTO film) 102 is formed by the LPCVD method at 700° C. using silane gas and nitrous oxide ($N_2O$) gas on the silicon substrate 1 having the semiconductor element 10 formed thereon. The silicon substrate is heated to 400° C. by the thermal CVD method to form a 0.5-μm thick BPSG (Boron Phospho-Silicate Glass) film using ozone gas, TEOS gas, trimethoxyborate ($B(COH_3)_3$: TMB) gas, and trimethyl phosphate ($PO(OCH_3)_3$: TMOP) gas.

The resultant structure is annealed in a nitrogen gas atmosphere at 800° C. for 30 minutes, and the BPSG film is reflowed to form a wiring insulating underlayer 103. Although the upper surface of this wiring insulating underlayer 103 is smooth, the upper surface has corrugations reflecting the step of the gate electrode 4 and the like which constitute the underlying semiconductor element 10, and is not flat. A step on the upper surface of the wiring insulating underlayer 103, i.e., the maximum value of a height difference is about 0.6 μm.

A contact hole (not shown) which reaches the semiconductor element 10 formed on the silicon substrate 1 is formed at a predetermined portion in the wiring insulating underlayer 103. Next, a titanium film 104 having a thickness of about 0.06 μm, a titanium nitride film 105 having a thickness of about 0.1 μm, an Al-Cu-Si alloy film 106 having a thickness of about 0.6 μm, and a titanium nitride film 105a having a thickness of about 0.05 μm are sequentially formed and stacked by sputtering or reactive sputtering. These four stacked metal films are patterned to form a multilayered interconnection 107.

Subsequently, a TEOS solution and water are bubbled with nitrogen gas at a substrate temperature of 400° C. and an ozone flow rate of 400 sccm using an APCVD apparatus shown in FIG. 2 to generate TEOS gas and water vapor. The TEOS gas and the water vapor are fed to the surface of the silicon substrate 1 including the multilayered interconnection 107 at 50 sccm and 120 sccm, respectively. Note that the APCVD apparatus in FIG. 2 will be described later. At the same time, as a characteristic step of the first embodiment, an aqueous phosphoric acid ($H_3PO_4$) solution as a compound having a catalysis is bubbled with nitrogen gas to generate phosphoric acid gas. The phosphoric acid gas is fed near the silicon substrate 1 at a flow rate of 5 sccm. Note that the phosphoric acid gas is used as only a catalyst. Therefore, addition of a large amount of phosphoric acid gas decreases the component ratio of a source gas. In other words, the required amount of phosphoric acid gas is only 10 mol % or less with respect to the feed amount of TEOS gas, such that the content of the compound gas is not more than 10 mol % with respect to the content of the main component gas. The bubbling temperature of the TEOS solution at this time is 65° C., that of water is 30° C., and that of the aqueous phosphoric acid solution is 25° C.

By feeding phosphoric acid gas together with TEOS gas, ozone, and water vapor, a silicon oxide film can be formed in the APCVD apparatus, rather than the silanol film formed as a reaction intermediate of TEOS, water, and ozone. For this reason, a silicon oxide film having a small number of Si—OH bonds and a low water content and poor water absorption properties can be formed without annealing by irradiating infrared rays, as required in the prior art. By the above-described method, a 1.5-μm thick silicon oxide film 108 can be formed on the surface of the silicon substrate 1 which includes the multilayered interconnection 107 formed selectively.

Figure 1C:
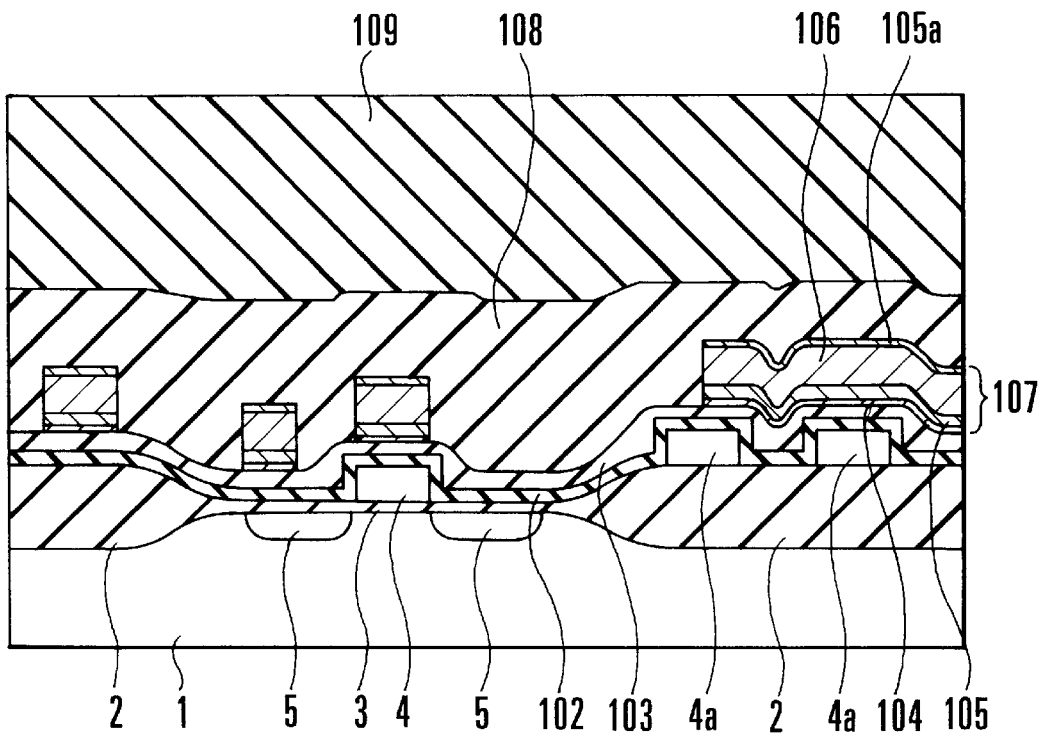

To form an upper wiring layer on the silicon oxide film 108, it is desirable to planarize the surface of the silicon oxide film 108 so as to prevent disconnection and shortcircuiting of the upper wiring layer. Therefore, as shown in FIG. 1C, an organic silica film 109 having a thickness of about 0.5 μm is formed on the silicon oxide film 108 by a spin coating method or the like.

Figure 1D:
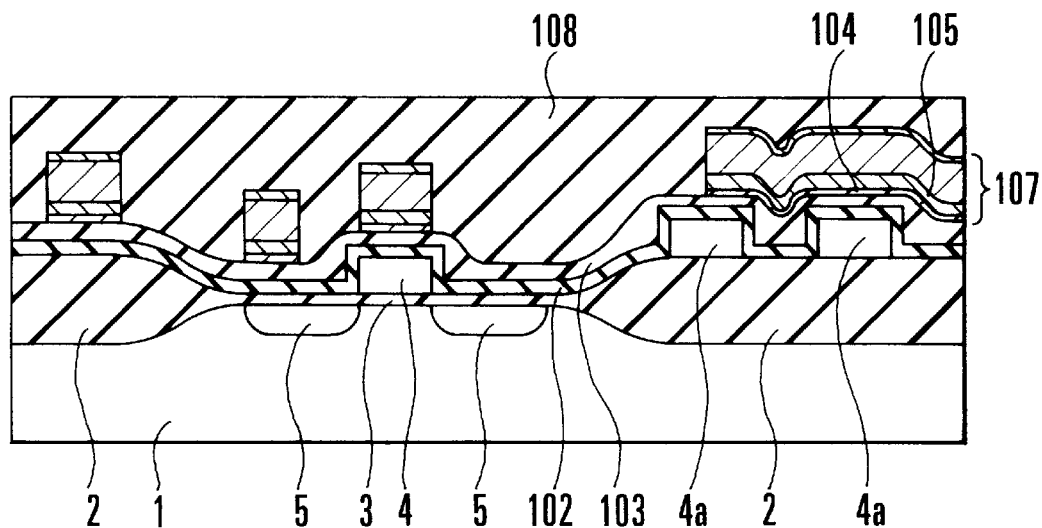

As shown in FIG. 1D, the organic silica film 109 and part of the silicon oxide film 108 are etched back by reactive ion etching (RIE) until the organic silica film 109 is completely removed. The etching conditions at this time are a carbon tetrafluoride ($CF_4$) flow rate of 100 sccm, an $O_2$ flow rate of 15 sccm, a pressure of 13 Pa, a power density of 0.3 W/cm$^2$, and an etching rate ratio of the organic silica film 109 : the silicon oxide film 108=1 : 1.

Next, the silicon oxide film 108 is selectively etched using a photoresist film as a mask to form a through hole 110 which reaches the lower multilayered interconnection 107, as shown in FIG. 1E. This through hole 110 is formed by anisotropic etching at a pressure of 10 Pa and a power of 1,200 W using trifluoromethane ($CHF_3$) gas and oxygen gas. Upon this etching, the alloy film 106 is exposed on the bottom portion of the through hole 110 because the etching rate with respect to the titanium nitride film 105 is also high.

As shown in FIG. 1F, a 0.01-μm thick titanium film 111 and a 0.05-μm thick titanium nitride film 112 are sequentially formed on the entire surface of the silicon oxide film 108 including the through hole 110 by sputtering and reactive sputtering. A 0.2-μm thick tungsten film 113 is formed on the titanium nitride film 112 by a blanket CVD method at a substrate temperature of 400° C. and a pressure of 5,000 Pa using tungsten(VI) fluoride ($WF_6$) gas and hydrogen gas.

The tungsten film 113 and the like are etched back by plasma etching at a pressure of 30 Pa and a power of 400 W using sulfur hexafluoride ($SF_6$) gas as an etching gas and argon gas as a carrier gas until the upper surface of the silicon oxide film 108 is exposed. At this time, the through hole 110 is filled with the titanium film 111, the titanium nitride film 112, and the tungsten film 113. Then, a 0.06-μm thick titanium film 114, a 0.1-μm thick titanium nitride film 115, a 0.60-μm thick Al—Cu—Si alloy film 116, and a 0.05-μm thick titanium nitride film 115a are sequentially formed and stacked on the silicon oxide film 108.

These stacked metal layers are patterned to form an upper multilayered interconnection 117, completing the steps of manufacturing the semiconductor device according to the first embodiment. The P concentration of the silicon oxide film 108 formed in the present invention is as very low as 2.0 atomic %.

Note that, in addition to the above-described TEOS, alkoxysilane or organosiloxane may be used. For example, hexaethoxydisiloxane ($Si_2O(OC_2H_5)_6$) may be used at a bubbling temperature of 90° to 100° C. In addition, hexamethoxydisiloxane ($Si_2O(OCH_3)_6$), hexanormalbutoxydisiloxane ($Si_2O(n\text{-}OC_3H_7)_6$), or hexaisobutoxydisiloxane ($Si_2O(i\text{-}OC_3H_7)_6$) as an isomer of hexanormalbutoxydisiloxane may be used.

Figure 3:
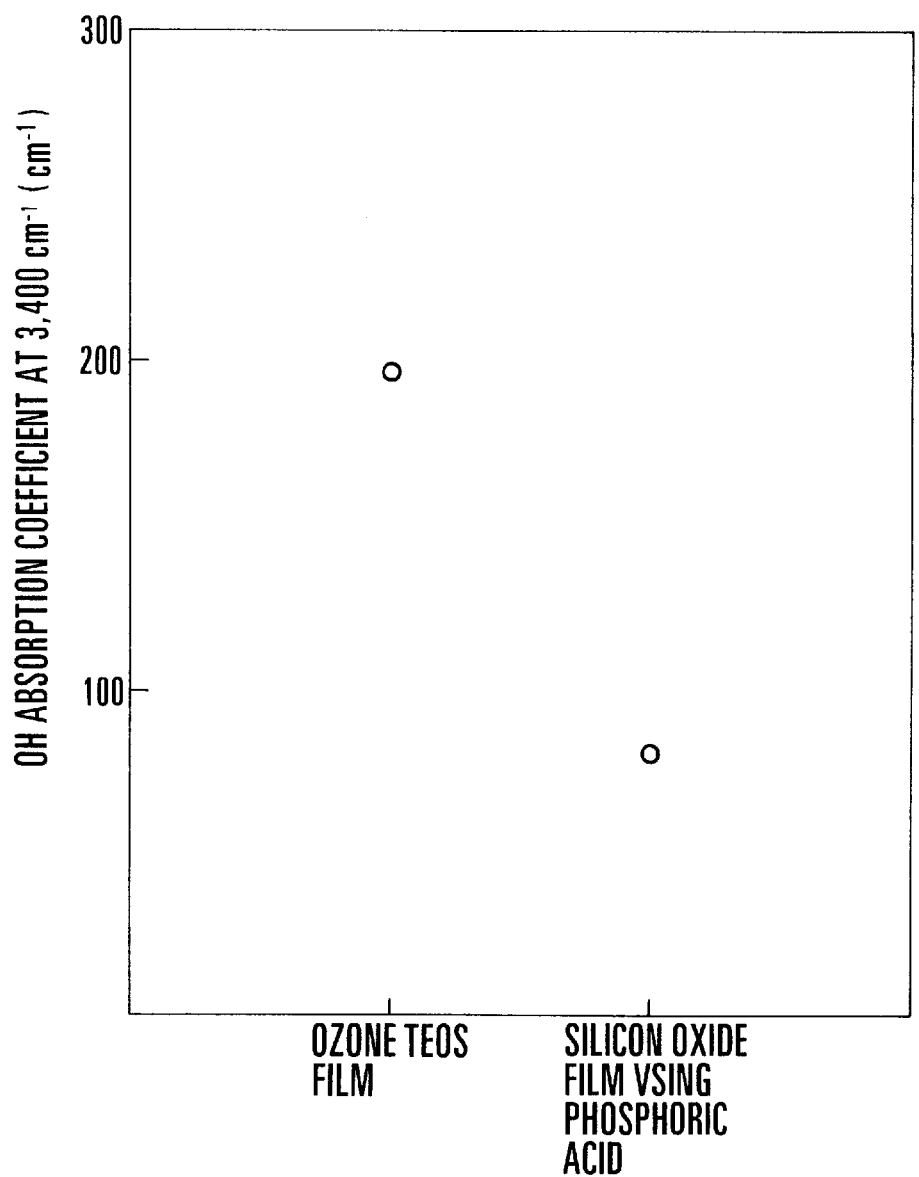
FIG. 3 is a graph showing the amount of OH radicals in a silicon oxide film.
Figure 5A:
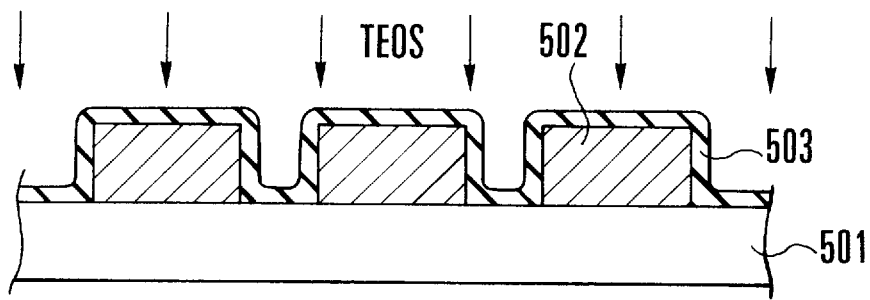
FIGS. 5A to 5E are sectional views showing a semiconductor device for explaining the steps of forming insulating interlayers on a polysilicon wiring layer according to a conventional method.
Figure 5B:
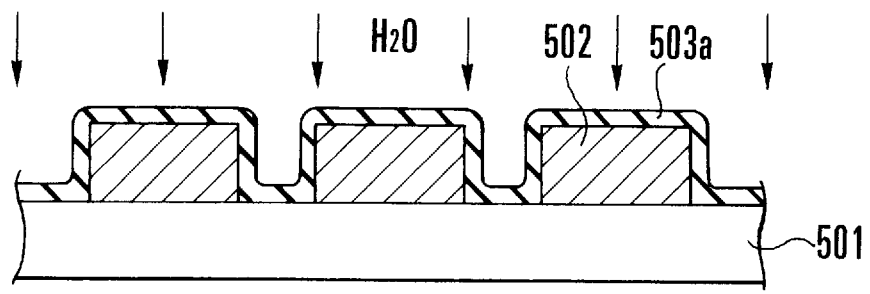
Figure 5C:
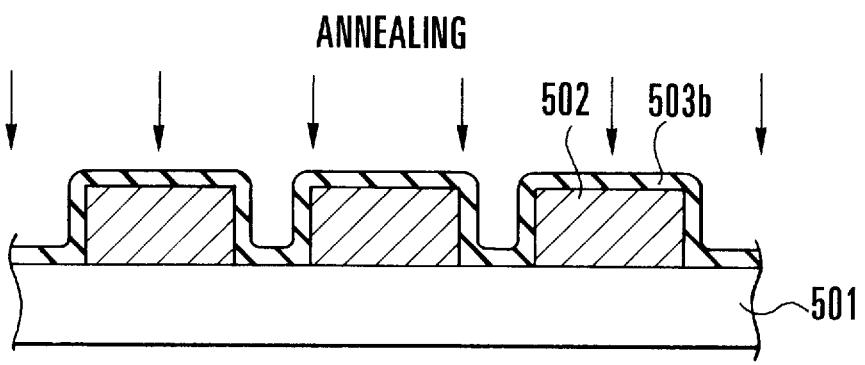
Figure 5D:
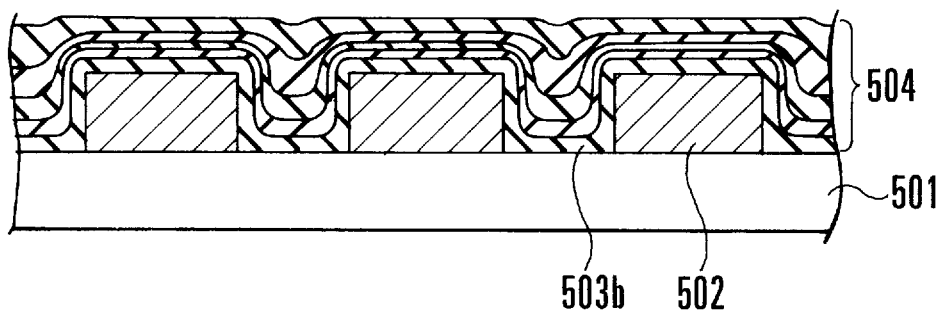
Figure 5E:
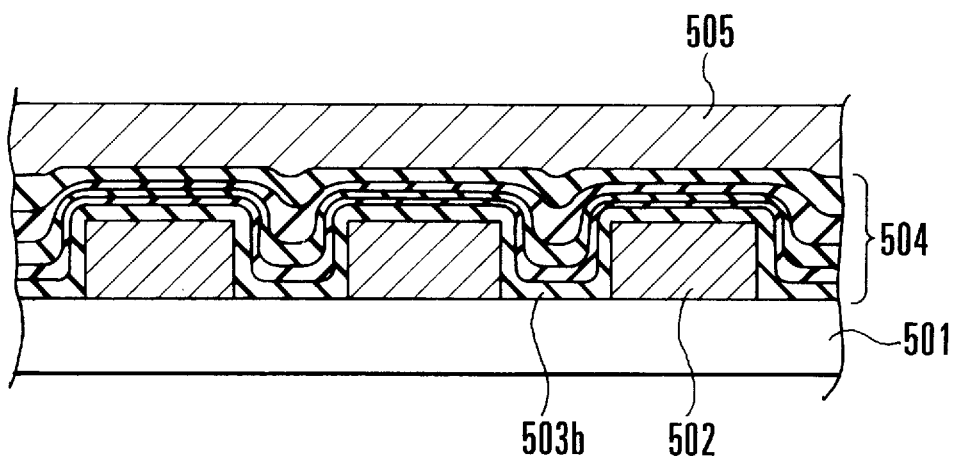
Figure 6:
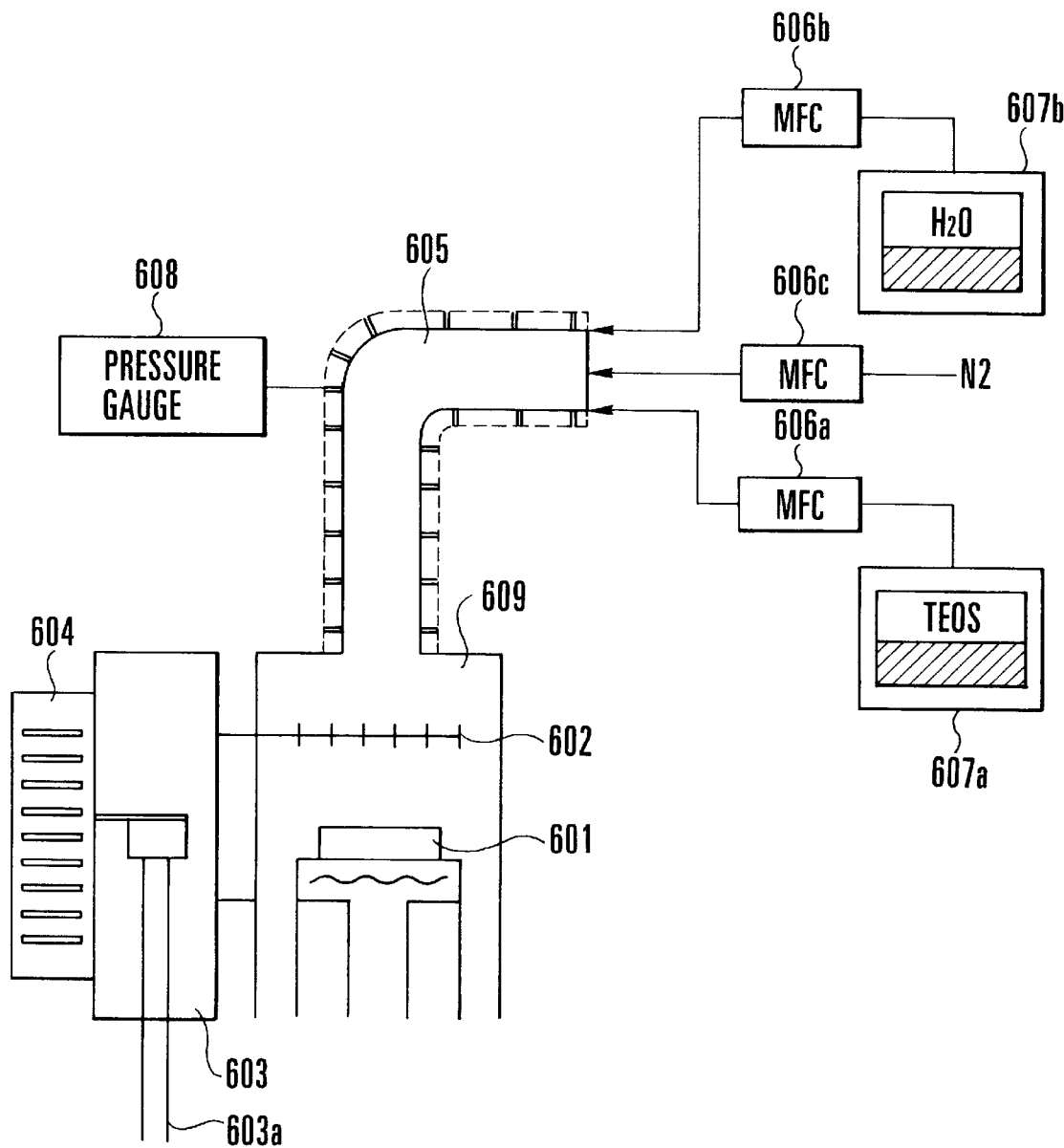
FIG. 6 is a view showing the arrangement of a film formation apparatus used to form a silicon oxide film according to a conventional method.

FIG. 3 shows the number of OH radicals in the silicon oxide film 108 formed by adding, to a reaction system, phosphoric acid as a catalyst for promoting growth of a silicon oxide film used in the first embodiment, and that in an ozone TEOS film formed by using ozone ($O_3$) and TEOS at the atmospheric pressure according to the prior art. As is apparent from FIG. 3, the number of OH radicals in the silicon oxide film formed by the present invention decreases about 50% lower than that in the ozone TEOS film. In response to the decrease in number of OH radicals in the silicon oxide film, leakage current in the ozone TEOS film decreased from $1 \times 10^{-9}$ A/cm$^2$ (1 MV/cm) to $3 \times 10^{-10}$ A/cm$^2$.

When a contact resistance was measured using an array of 50,000 via holes, each having a diameter of 0.6 μm, a connection resistance decreased from about 0.90 Ω/hole to 0.70 Ω/hole. In addition, a nondetective ratio increased from 90% to 95%. The resistance of the silicon oxide film 108 was $1.8 \times 10^{16}$ Ω•cm higher than that of the ozone TEOS film of $\rho = 0.6 \times 10^{16}$ Ω•cm, which indicates that the insulating properties between the wiring layers were improved.

Variations ($\Delta V_\tau$) in threshold voltage ($V_\tau$) in the silicon oxide film 108 was compared to that in the ozone TEOS film in a high-temperature bias test (BT). The conditions of this test were $\Delta V_\tau/V_\tau = -25\%$ in the ozone TEOS film, and $\Delta V_\tau/V_\tau = -9\%$ in the present invention. Further, a film shrinkage factor in annealing at 450° C. decreased from 5% to 2%. In a stress migration test at 250° C. for 300 hours, there was no disconnection in a lower wiring layer. Moreover, the formed silicon oxide film 108 could be buried in a multi-layered interconnection space in an interval as small 0.35 µm or less without any void.

Note that phosphoric acid is used as a compound indicating a catalysis in the first embodiment. The compound, however, is not limited to this, and the same effect can be obtained even with trimethyl phosphate ($PO(OCH_3)_3$: TMOP) and the like. Also in the above embodiment, the Al multilayered interconnection 107 is exemplified, but a multilayered interconnection is not limited to this.

Second Embodiment

The second embodiment of the present invention will be described below.

As in the first embodiment shown in FIG. 1A, a structure up to a multilayered interconnection 107 is formed. Similar to FIG. 1B, a silicon oxide film 108 is formed on the surface including the multilayered interconnection 107. The silicon oxide film 108 was formed using the APCVD apparatus shown in FIG. 2 in the second embodiment.

Figure 2:
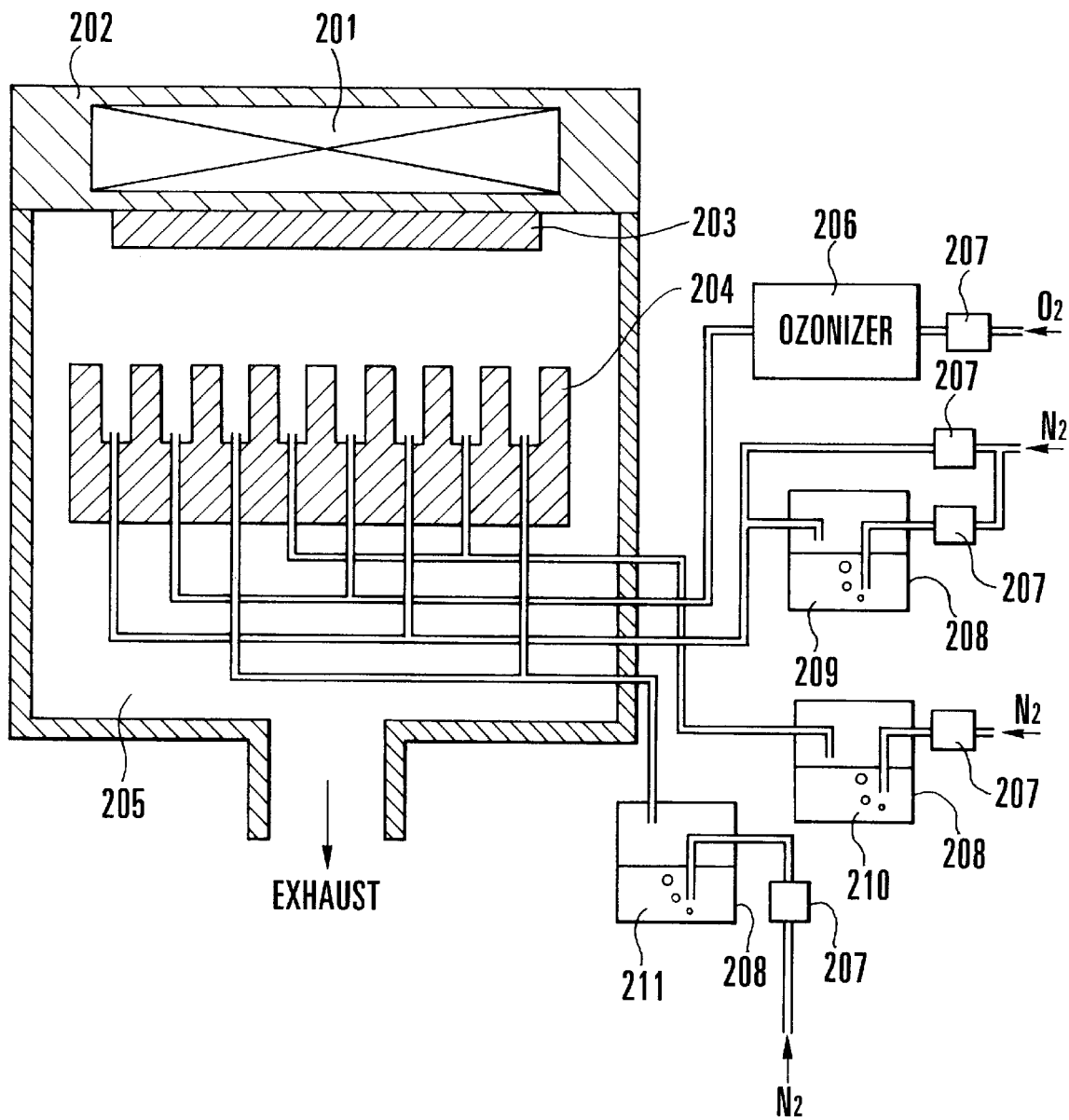
FIG. 2 is a view showing the arrangement of an APCVD apparatus used in a second embodiment.

Referring to FIG. 2, reference numeral 201 denotes a heater for heating a reaction chamber; 202, a susceptor; 203, a semiconductor wafer to be processed; 204, a dispersion head; 205, a reaction chamber; 206, an ozonizer for generating ozone from oxygen; 207, flow controllers for controlling gas flow rates; 208, constant-temperature baths for bubbling solutions kept at predetermined temperatures; 209, a TEOS solution; 210, an aqueous boric acid solution exhibiting a catalysis; and 211, water.

A method of forming the silicon oxide film 108 using this APCVD apparatus will be described below. First, the TEOS solution 209 and the water 211 are bubbled with nitrogen gas at a temperature of the wafer 203 of 400° C. and an ozone flow rate of 400 sccm from the ozonizer 206 to generate TEOS gas and water vapor. The TEOS gas and the water vapor are fed onto the wafer 203 at 50 sccm and 120 sccm, respectively.

The aqueous boric acid ($H_3BO_3$) solution 210 as a compound having a catalysis is bubbled with nitrogen gas to generate boric acid gas. The boric acid gas is fed near the wafer 203 at a flow rate of 5 sccm to promote dehydration and condensation reaction of a reaction intermediate of TEOS, water, and ozone. At this time, the bubbling temperature of the TEOS solution 209 is 65° C., that of the water 211 is 30° C., and that of the aqueous boric acid solution 210 is 25° C.

According to the above method, the silicon oxide film 108 is formed on the surface of a silicon substrate 1 which includes the multilayered interconnection 107 formed selectively, like the structure shown in FIG. 1D. Subsequent steps of completing the manufacture of a semiconductor device are the same as in FIGS. 1C to 1F, and a description thereof will be omitted. Note that the boron (B) concentration in the silicon oxide film 108 formed in the second embodiment was as very low as 0.5 atomic %.

As described above, if boric acid is used as a compound having a catalysis in the second embodiment, the same effects can be obtained as in the first embodiment using phosphoric acid in terms of a decrease in OH radicals in the silicon oxide film and suppression of surface roughness. Note that, in the second embodiment, boric acid is used as an acid containing boron exhibiting a catalysis. The compound, however, is not limited to the boric acid, and the same effect can be obtained even with trimethyl borate ($B(OCH_3)_3$: TMB) and the like. Further, electrical characteristics such as a connection resistance and threshold voltage variations were measured in a two-level interconnection structure identical to that in FIG. 1F to obtain the same results as in the first embodiment.

Third Embodiment

The third embodiment of the present invention will be described below.

As in the first embodiment shown in FIG. 1A, a structure up to a multilayered interconnection 107 is formed. Similar to FIG. 1B, a silicon oxide film 108 is formed on the surface including the multilayered interconnection 107. The silicon oxide film 108 was formed using an APCVD apparatus shown in FIG. 4 in the third embodiment.

A method of forming the silicon oxide film 108 using this APCVD apparatus will be described below. First, a TEOS solution 309 and water 311 are bubbled with nitrogen gas at a temperature of a wafer 303 of 400° C. and an ozone flow rate of 400 sccm to generate TEOS gas and water vapor. The TEOS gas and the water vapor are fed onto the wafer 303 at 50 sccm and 120 sccm, respectively.

Hydrogen fluoride (HF) gas as a compound having a catalysis is fed near the wafer 303 at a flow rate of 5 sccm to promote dehydration and condensation reaction of a reaction intermediate of TEOS, water, and ozone. At this time, the bubbling temperature of the TEOS solution 309 is 65° C., and that of the water 311 is 30° C. Reference numeral 301 denotes a heater; 302, a susceptor; 304, a dispersion head; 305, a reaction chamber; 306, an ozonizer for generating ozone from oxygen; 307, a flow controller; and 308, a constant-temperature bath.

According to the above method, the silicon oxide film 108 is formed on the surface of a silicon substrate 1 which includes the multilayered interconnection 107 formed selectively, like the structure shown in FIG. 1D. Subsequent steps of completing the manufacture of a semiconductor device are the same as in FIGS. 1C to 1F, and a description thereof will be omitted. Note that the fluorine (F) concentration in the silicon oxide film 108 formed in the third embodiment was as very low as 1.2 atomic %.

As described above, if fluorine is used as a compound having a catalysis in the third embodiment, the same effects can be obtained as in the first embodiment using phosphoric acid in terms of a decrease in OH radicals in the silicon oxide film 108 and suppression of surface roughness. Further, electrical characteristics such as a connection resistance and threshold voltage variations were measured in a two-level interconnection structure identical to that in FIG. 1F to obtain the same results as in the first embodiment.

Fourth Embodiment

The fourth embodiment of the present invention will be described below.

As in the first embodiment shown in FIG. 1A, a structure up to a multilayered interconnection 107 is formed. Then, a TEOS solution 309 and water 311 are bubbled with nitrogen gas at a temperature of a wafer 303 of 400° C. and an ozone flow rate of 400 sccm to generate TEOS gas and water vapor. The TEOS gas and the water vapor are respectively fed onto the wafer 303 at 50 sccm and 120 sccm using the APCVD apparatus shown in FIG. 4.

Ammonia ($NH_3$) gas as a compound having a catalysis is fed near the wafer 303 at a flow rate of 5 sccm to promote dehydration and condensation reaction of a reaction intermediate of TEOS, water, and ozone. At this time, the bubbling temperature of the TEOS solution 309 is 65° C., and that of the water 311 is 30° C.

According to the above method, a silicon oxide film 108 is formed on the surface of a silicon substrate 1 which includes the multilayered interconnection 107 formed selectively, like the structure shown in FIG. 1D. Subsequent steps of completing the manufacture of a semiconductor device are the same as in FIGS. 1C to 1F, and a description thereof will be omitted.

As described above, if ammonia is used as a compound having a catalysis in the fourth embodiment, the same effects can be obtained as in the first embodiment using phosphoric acid in terms of a decrease in OH radicals in the silicon oxide film 108 and suppression of surface roughness. Further, electrical characteristics such as a connection resistance and threshold voltage variations were measured in a two-level interconnection structure identical to that in FIG. 1F to obtain the same results as in the first embodiment.

As has been described above, according to the present invention, when a silicon oxide film is to be formed on, e.g., an Al wiring layer using ozone and TEOS, a compound having a catalysis for promoting generation of the silicon oxide film is added. With this step, the number of Si—OH radical bonds in the formed silicon oxide film can be greatly decreased. Therefore, an insulating interlayer having good step coverage with respect to a lower wiring layer and a small water content, and free from generation of cracks can be effectively formed.

What is claimed is:

1. A method of manufacturing a semiconductor device, comprising the steps of:

forming a lower wiring layer on a semiconductor substrate through an insulating film;

adding a stall quantity of compound gas having a catalytic effect for promoting formation of silicon oxide using a main component gas comprising a large quantity of ozone, water vapor, and one of alkoxysilane and organosiloxane as a source gas to form a silicon oxide insulating film by a chemical vapor deposition (CVD) method on a surface of said semiconductor substrate on which said lower wiring layer is formed, said small quantity of the compound gas being small relative to the quantity of said main component gas and said large quantity of ozone being large relative to quantities of the water vapor and said one of alkoxysilane-and organosiloxane; and forming an upper wiring layer on said silicon oxide film.

2. A method according to claim 1, wherein the added compound gas consists of one acid gas comprising one of phosphorus, boron, and fluorine.

3. A method according to claim 1, wherein the added compound gas is a gas containing alkali.

4. A method according to claim 3, wherein the gas containing alkali is ammonia gas.

5. A method according to claim 1, wherein the compound gas is not more than 10 mol % with respect to the content of the main component gas.

6. A method according to claim 1, wherein the CVD method is an atmospheric pressure CVD method.

7. A method according to claim 1, wherein the compound gas promotes dehydration and condensation reaction of a reaction intermediate of the source gas, water vapor, and ozone.

8. A method of manufacturing a semiconductor device, comprising the steps of:

forming a lower wiring layer on a semiconductor substrate through an insulating film;

adding a phosphoric acid gas having a catalysis at a flow rate of 5 sccm in an environment of a tetraethoxysilane (TEOS) gas having a flow rate substantially equal to 50 sccm, an ozone having a flow rate substantially equal to 400 sccm, and a water vapor having a flow rate substantially equal to 120 sccm at a substrate temperature of approximately 400° C. and at approximately atmospheric pressure to form a silicon oxide film by a chemical vapor deposition (CVD) method on a surface of said semiconductor substrate at the substrate temperature of 400° C.; and forming an upper wiring layer on said silicon oxide film.

9. A method according to claim 2, wherein said compound gas is added at a flow rate substantially equal to 5 sccm, said water vapor is added at a flow rate substantially equal to 120 sccm, and said one of alkoxysilane and organosiloxane is added at a flow rate substantially equal to 50 sccm.

10. A method according to claim 3, wherein said compound gas is added at a flow rate substantially equal to 5 sccm, said water vapor is added at a flow rate substantially equal to 120 sccm, and said one of alkoxysilane and organosiloxane is added at a flow rate substantially equal to 50 sccm.

11. A method of manufacturing a semiconductor device, comprising the steps of:

forming a lower wiring layer on a semiconductor substrate through an insulating film;

adding a compound gas having a catalytic effect for promoting formation of silicon oxide using a main component gas comprising ozone, water vapor, and one of alkoxysilane and organosiloxane as a source gas to form a silicon oxide insulating film by a chemical vapor deposition (CVD) method on a surface of said semiconductor substrate on which said lower wiring layer is formed, wherein the quantity of compound gas is not more than 10 mol % with respect to a quantity of the main component gas; and forming an upper wiring layer on said silicon oxide insulating film, wherein the added compound gas consists of one acid gas comprising one of phosphorus, boron, and fluorine.

12. A method according to claim 11, wherein the CVD method is an atmospheric pressure CVD method.

13. A method according to claim 11, wherein the compound gas promotes dehydration and condensation reaction of a reaction intermediate of the source gas, water vapor, and ozone.

14. A method of manufacturing a semiconductor device, comprising the steps of:

forming a lower wiring layer on a semiconductor substrate through an insulating film;

adding a small quantity of acid gas having a catalytic effect, said acid gas comprising one of: phosphorous, boron, and fluorine, for promoting formation of silicon oxide using a main component gas comprising ozone, water vapor, and one of alkoxysilane and organosiloxane as a source gas to form a silicon oxide insulating film by a chemical vapor deposition (CVD) method on a surface of said semiconductor substrate on which said lower wiring layer is formed, said small quantity of the acid gas being small relative to the quantity of said main component gas; and forming an upper wiring layer on said silicon oxide film.

15. A method of manufacturing a semiconductor device, comprising the steps of:

forming a lower wiring layer on a semiconductor substrate through an insulating film;

adding a small quantity of alkali gas having a catalytic effect for promoting formation of silicon oxide using a main component gas comprising a large quantity of ozone, water vapor, and one of alkoxysilane and organosiloxane as a source gas to form a silicon oxide insulating film by a chemical vapor deposition (CVD) method on a surface of said semiconductor substrate on which said lower wiring layer is formed, said small quantity of the alkali gas being small relative to the quantity of said main component gas; and forming an upper wiring layer on said silicon oxide film.

* * * * *

UNITED STATES PATENT AND TRADEMARK OFFICE
CERTIFICATE OF CORRECTION

PATENT NO.: 5,840,631
DATED: November 24, 1998
INVENTOR(S): Akira KUBO, HOMMA, TETSUYA, KISHIMOTO, KOJI It is certified that error appears in the above-identified patent and that said Letters Patent is hereby corrected as shown below:

Column 1, Line 12  delete "or" and insert --on--

Column 2, Line 11  delete "0H" and insert --OH--

Column 9, Line 31  delete "stall" and insert --small--

Signed and Sealed this

Twentieth Day of July, 1999

*Attest:*

Q. TODD DICKINSON

*Attesting Officer*  Acting Commissioner of Patents and Trademarks